United States Patent
Wang et al.

(10) Patent No.: US 12,457,715 B2
(45) Date of Patent: Oct. 28, 2025

(54) POWER MODULE AND MANUFACTURING METHOD THEREOF, POWER CONVERTER, AND POWER SUPPLY DEVICE

(71) Applicant: Huawei Digital Power Technologies Co., Ltd., Shenzhen (CN)

(72) Inventors: Yibo Wang, Shanghai (CN); Wengang Luo, Shanghai (CN); Yunfei Qiao, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 338 days.

(21) Appl. No.: 18/189,692

(22) Filed: Mar. 24, 2023

(65) Prior Publication Data
US 2023/0309276 A1 Sep. 28, 2023

(30) Foreign Application Priority Data
Mar. 26, 2022 (CN) .......................... 202210304634.0

(51) Int. Cl.
*H05K 7/20* (2006.01)
(52) U.S. Cl.
CPC ......... *H05K 7/209* (2013.01); *H05K 7/20409* (2013.01); *H05K 2201/10166* (2013.01); *H05K 2201/10174* (2013.01)

(58) Field of Classification Search
None
See application file for complete search history.

(56) References Cited

U.S. PATENT DOCUMENTS

| 6,509,629 | B2* | 1/2003 | Yoshimatsu | .......... H01L 23/552 |
| | | | | 257/691 |
| 6,787,893 | B2* | 9/2004 | Nakajima | ............... H01L 24/49 |
| | | | | 257/710 |
| 2009/0194869 | A1 | 8/2009 | Eom et al. | |
| 2011/0298121 | A1* | 12/2011 | Nishibori | ............. H01L 25/072 |
| | | | | 257/784 |
| 2013/0135824 | A1* | 5/2013 | Harubeppu | ............. H01L 23/42 |
| | | | | 361/709 |
| 2014/0217572 | A1* | 8/2014 | Eom | ..................... H01L 25/165 |
| | | | | 257/693 |

(Continued)

FOREIGN PATENT DOCUMENTS

CN 113629045 A 11/2021
DE 102015115132 A1 3/2017

(Continued)

*Primary Examiner* — Courtney L Smith
(74) *Attorney, Agent, or Firm* — Conley Rose, P.C.

(57) ABSTRACT

A power module includes a housing, a circuit component, and a package. The housing includes a main housing, a heat sink, and a fastening layer. A first outer surface of the main housing is provided with a groove. The fastening layer is disposed on a bottom surface of the groove. The heat sink is located on a side opposite to an orientation of the groove. The circuit component includes a heat dissipation surface and a pin. The heat dissipation surface is fastened to the fastening layer through welding. The pin extends out of the first outer surface in a direction away from the fastening layer. The package is configured to cover the circuit component, and to at least partially expose a distal end of the pin.

20 Claims, 12 Drawing Sheets

(56) References Cited

U.S. PATENT DOCUMENTS

| | | | |
|---|---|---|---|
| 2016/0111345 A1* | 4/2016 | Kawase | H01L 23/3675 |
| | | | 257/706 |
| 2017/0064808 A1* | 3/2017 | Rizza | H01L 25/18 |
| 2017/0287798 A1 | 10/2017 | Brucchi et al. | |
| 2021/0134686 A1* | 5/2021 | Ishibashi | H01L 23/24 |

FOREIGN PATENT DOCUMENTS

| | | | | |
|---|---|---|---|---|
| JP | 2008288495 A | * | 11/2008 | H01L 23/24 |
| KR | 20060082626 A | | 7/2006 | |

* cited by examiner

POWER MODULE AND MANUFACTURING METHOD THEREOF, POWER CONVERTER, AND POWER SUPPLY DEVICE

CROSS-REFERENCE TO RELATED APPLICATION

This application claims priority to Chinese Patent Application No. 202210304634.0 filed on Mar. 26, 2022, which is hereby incorporated by reference in its entirety.

TECHNICAL FIELD

This application relates to the field of circuits, and in particular, to a power module, a method for manufacturing a power module, a power converter including the power module, and a power supply device including the power converter.

BACKGROUND

A power converter is widely used in the fields of servo motors, frequency converters, inverters, and the like, and is configured to implement functions such as alternating current-to-direct current conversion and direct current boost/buck. The power converter is formed by combining a power module and another electronic device based on specific functions. The power module usually has a defect of poor sealing performance. In addition, breakdown of the power module may occur due to insufficient heat dissipation, excessive transient current, or the like in a working process. An existing packaging material cannot shield an arc damage of the breakdown, and a large quantity of electronic devices in the power converter are easily damaged.

SUMMARY

This application provides a power module, a method for manufacturing a power module, and a power converter including the power module. In addition to improving sealing performance of the power module, a breakdown arc direction of the power module can be further controlled, to reduce damage caused by a fault of the power module. This application includes the following technical solutions.

According to a first aspect, this application provides a power module, including a housing, where the housing includes a main housing, a heat sink, and a fastening layer, the main housing is provided with a groove, a groove opening is located in on first outer surface, the fastening layer is disposed on a bottom surface of the groove, and the heat sink is located on a side away from an orientation of the groove opening; a circuit component, accommodated in a groove, where the circuit component includes a heat dissipation surface and a pin, the heat dissipation surface is fastened to the fastening layer through welding, the pin extends toward a direction away from the fastening layer, and a distal end of the pin extends out of a first outer surface; and a package, where the package is filled in the groove, and is configured to cover the circuit component, and to at least partially expose the distal end of the pin.

In the power module according to this application, the groove is disposed on the housing, so as to form an accommodating cavity with a bottom surface and a side wall made of a metal material. The circuit component is accommodated in the groove, so that protection strength of the circuit component can be improved. A structure of the fastening layer disposed on the bottom surface can achieve better welding and fastening effect on the circuit component, and improve heat conduction efficiency of the circuit component. The pin of the circuit component extends out of both the outer surface of the housing and the package, which also ensures connection reliability of the power module and an external device. When a breakdown accident occurs on the power module in this application, a structure of the groove can form reliable protection for the power module, and control an arc to propagate only toward the groove opening of the groove, thereby reducing fault damage of the power module.

In a possible implementation, the fastening layer is formed on the bottom surface of the groove through electroplating, or is formed on a bottom of the groove in an embedded manner.

In this implementation, the structure of the fastening layer may be formed on the bottom surface of the groove through electroplating or in an embedded manner, and connection reliability of the fastening layer at the bottom of the housing is ensured.

In a possible implementation, a main material of the fastening layer is copper, tin, nickel, or silver.

In a possible implementation, a connection layer is further disposed between the fastening layer and the heat dissipation surface, and a main material of the connection layer is tin, silver, copper, or resin.

In this implementation, tin, silver, copper, or resin is used as the connection layer to fasten the circuit component to the fastening layer, which can ensure heat conduction efficiency between the circuit component and the housing, and improve heat dissipation effect of the power module.

In a possible implementation, main materials of the main housing and the heat sink are metal with a thermal conductivity greater than or equal to 120 Watts/meter-Kelvin (W/mK).

In a possible implementation, main materials of the main housing and the heat sink are aluminum.

In this embodiment, the aluminum has a relatively high thermal conductivity, light weight, and low costs, heat dissipation effect of the power module can be better improved, and the overall costs can be reduced.

In a possible implementation, the circuit component further includes a circuit board, a chip, and a bonding wire. One side surface of the circuit board forms the heat dissipation surface, the chip and the pin are attached to the other side surface of the circuit board, and the bonding wire is connected between the chip and the pin.

In this implementation, the circuit component implements a power conversion function by the chip carried on the circuit board, and implements an electrical connection between the circuit component and an external device by the pin.

In a possible implementation, a bonding wire is further connected between two chips.

In a possible implementation, the chip includes one or more of a metal-oxide-semiconductor field-effect transistor (MOSFET), an insulated gate bipolar transistor (IGBT), a diode, or a triode.

In a possible implementation, the circuit board includes a ceramic substrate, a first copper layer, and a second copper layer. The first copper layer and the second copper layer are respectively attached to two opposite sides of the ceramic substrate, and the heat dissipation surface is formed on the first copper layer.

In this implementation, the circuit board may be implemented by using a copper-clad ceramic piece. The first copper layer of the circuit board is configured to implement a reliable connection to the bottom surface of the groove, and the second copper layer is configured to implement an electrical connection function of the chip, the bonding wire, and the pin.

In a possible implementation, a side that is of the package and that is away from the bottom surface is flush with the first outer surface or is lower than the first outer surface.

In this embodiment, the height of the package is limited, which can ensure that a distal end of the pin is reliably exposed relative to the first outer surface, and connection stability between the power module and the external device is ensured.

In a possible implementation, a material of the package is epoxy resin or silicon gel.

In a possible implementation, the groove includes a side wall. The side wall is connected between the first outer surface and the bottom surface, and a shape of any cross section that is of the side wall and that is perpendicular to the first outer surface is a stepped shape.

In this implementation, the cross-sectional shape of the side wall is set as the stepped shape, which can increase a contact area between the package and the side wall, and ensure sealing effect between the package and the side wall.

In a possible implementation, projection of the groove opening of the groove on the bottom surface is accommodated within the bottom surface.

In this implementation, an area of the groove opening of the groove is set to be less than that of the bottom surface of the groove, so that the groove can achieve better holding effect on the package, and structural stability of the power module can be improved.

According to a second aspect, this application provides a method for manufacturing a power module, including the following steps: attaching a chip to one side surface of a circuit board, and fastening one end of a bonding wire to the chip; fastening a pin to the circuit board, and connecting the pin to the other end of the bonding wire; and fastening the other side surface of the circuit board to a fastening layer of a housing through welding, where the fastening layer is located on a bottom surface of a groove formed in the housing; and filling the groove with a packaging material, so as to cover the circuit board, the chip, and the bonding wire, and to partially cover the pin.

In the manufacturing method for a power module in this application, after a structure of a circuit component is formed, the circuit component is attached to the bottom surface of the groove, and then the groove is packaged, so that this method may be used to manufacture the power module provided in the first aspect of this application. It may be understood that the power module manufactured by using the method in this application also has beneficial effect of high reliability, a strong heat dissipation capability, and relatively small fault damage in the case of breakdown of the foregoing power module.

In a possible implementation, the fastening the other side surface of the circuit board to a fastening layer of a housing through welding includes: fastening the other side surface of the circuit board to the fastening layer of the housing through welding by using tin soldering, silver sintering, copper sintering, silver paste, or prepreg.

In this implementation, because the fastening layer is disposed on the bottom surface of the groove, the fastening layer can be connected and fastened to the circuit component by using the foregoing process, and heat conduction efficiency between the circuit component and the groove can be improved.

According to a third aspect, this application provides a power converter, including a control module and the power module provided in the first aspect of this application. The control module is configured to control on or off of at least one power module, so as to implement power conversion.

According to a fourth aspect, this application provides a power supply device, including a power supply and the power converter provided in the third aspect of this application, where the power supply is electrically connected to the power converter, and outputs electrical energy through the power converter.

It may be understood that, because the power converter provided in the third aspect of this application uses the power module provided in the first aspect of this application, and the power supply device provided in the fourth aspect of this application also uses the power converter, beneficial effect of the two is roughly the same as those of the power module provided in the first aspect of this application. Details are not described herein again.

DESCRIPTION OF EMBODIMENTS

The following describes the technical solutions in embodiments of this application with reference to the accompanying drawings in embodiments of this application. It is clear that the described embodiments are merely a part rather than all of embodiments of this application. All other embodiments obtained by a person of ordinary skill in the art based on embodiments of this application without creative efforts shall fall within the protection scope of this application.

The power supply device according to this application includes a power supply and a power converter. The power supply is configured to provide electrical energy. The power converter is electrically connected to the power supply, and is configured to perform power conversion on the electrical energy provided by the power supply, so as to achieve effect of providing the electrical energy to an electric device according to a preset specification and ensuring normal working of the electric device. A semiconductor circuit may be disposed in the power supply device. The power converter is applied to the semiconductor circuit, and may be further configured to implement power conversion functions such as alternating current-to-direct current conversion and direct current boost/buck. The power supply device in this application may be a device such as a servo motor, a frequency converter, or an inverter.

Figure 1:
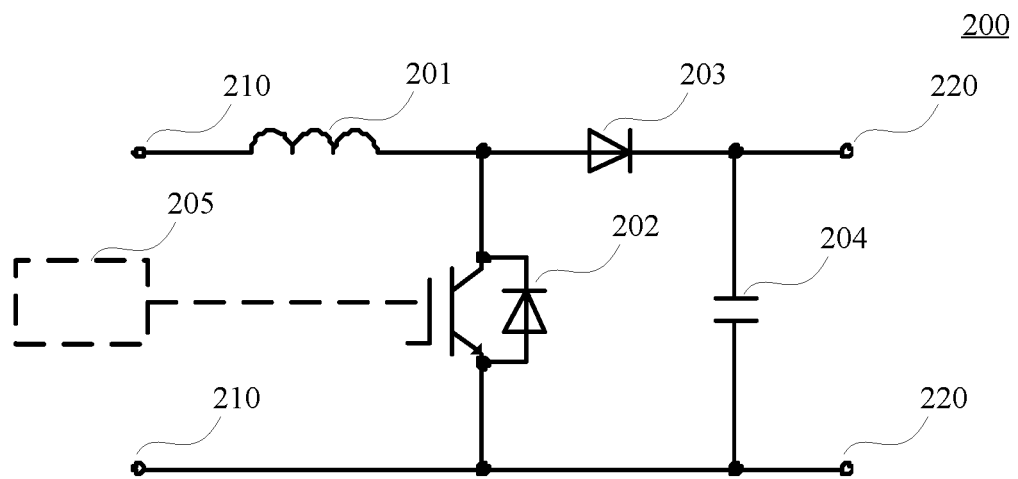
FIG. 1 is a circuit diagram of a power converter in a usage scenario according to an embodiment of this application.

FIG. 1 is a schematic diagram of a circuit of a power converter in a semiconductor circuit 200 according to this application.

In the schematic diagram of FIG. 1, the semiconductor circuit 200 is a boost circuit (BOOST). Further, the semiconductor circuit 200 includes an inductor 201, a first power module 202, a second power module 203, a capacitor 204, and a control module 205. The first power module 202 and the second power module 203 may be power modules provided in FIG. 3 to FIG. 13 in this application. The control module 205 and the first power module 202 form a power converter according to this application.

In this embodiment, the semiconductor circuit 200 is configured to boost a first voltage of power received from an input end 210 to a second voltage, and the second voltage is output from an output end 220, so that a power conversion function is implemented.

The inductor 201 is configured to implement energy storage and energy release of electrical energy of the power provided by the input end 210.

The capacitor 204 is connected to the output end 220, and is configured to obtain the second voltage after filtering the electrical energy of the power when the inductor 201 releases energy.

The second power module 203 may be a diode, and is connected between the inductor 201 and the capacitor 204 to implement unidirectional energy release of the inductor 201 to the output end 220.

The control module 205 and the first power module 202 are jointly used as a power converter of the semiconductor circuit 200, that is, as a controllable switch. The controllable switch is connected to the inductor 201 and the input end 210, to provide an energy storage path for the inductor 201.

Further, the control module 205 is configured to control on or off of the first power module 202. When the first power module 202 is in an on state, the inductor 201 is connected between two input ends 210, and is in the energy storage path to store the electrical energy. When the first power module 202 is in an off state, the inductor 201 is connected to the output end 220 through the second power module 203 to form an energy release path, so that the electrical energy stored by the inductor 201 may be released, thereby achieving boost effect of the semiconductor circuit 200.

Figure 2:
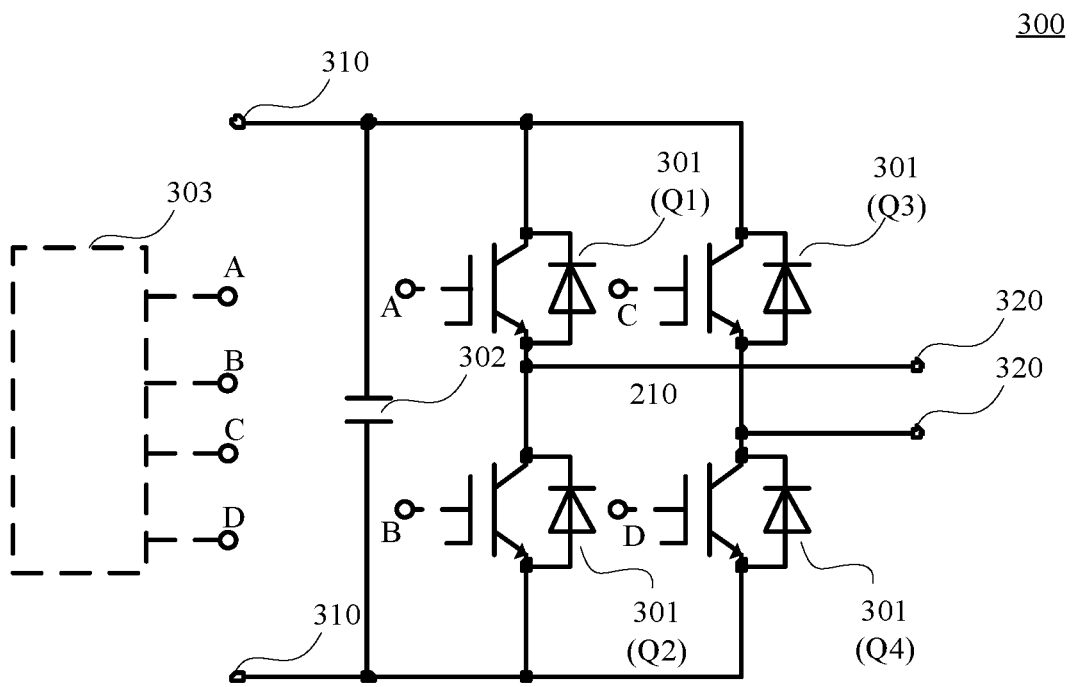
FIG. 2 is a circuit diagram of another power converter in a usage scenario according to an embodiment of this application.

FIG. 2 is a schematic diagram of a circuit of another power converter in a semiconductor circuit 300 according to this application.

In the schematic diagram of FIG. 2, the semiconductor circuit 300 is an inverter circuit. Further, the semiconductor circuit 300 includes four power modules 301, a control module 303, and a capacitor 302. The four power modules 301 are also the power modules provided in FIG. 3 to FIG. 13 in this application. The control module 303 is configured to control on or off of each power module 301, and work together with each power module 301 to form a power converter according to this application.

The four power modules 301 are defined as switches Q1 to Q4 and form two bridge arms. Each bridge arm includes two power modules 301 connected in series to positive and negative electrodes of the semiconductor circuit 300. The capacitor 302 is connected between a positive electrode and a negative electrode of an input end 310 to filter a voltage and a current in the input end 310 of the semiconductor circuit 300.

In the semiconductor circuit 300 shown in FIG. 2, under control of the control module 303, the four power modules 301 are also used as controllable switches, and two different conductive paths are formed by controlling on and off states of the four power modules 301 in the two bridge arms.

Further, the control module 303 has four control ports A\B\C\D, which respectively control on and off of the four power modules 301 Q1\Q2\Q3\Q4. When the switches Q1 and Q4 are in an on state and the switches Q2 and Q3 are in an off state, the positive and negative electrodes of the semiconductor circuit 300 are in a positive phase transmission. When the switches Q2 and Q3 are in an on state and the switches Q1 and Q4 are in an off state, the positive and negative electrodes of the semiconductor circuit 300 are in a negative phase transmission. The positive and negative polarities of the voltages obtained by the output end 320 in the two states are reversed. Therefore, the semiconductor circuit 300 shown in FIG. 2 implements an inversion function. Direct current-to-alternating current conversion or alternating current-to-direct current conversion can be implemented to implement a power conversion function.

It may be learned from FIG. 1 and FIG. 2 that, in the semiconductor circuit 200 and the semiconductor circuit 300, the power converter according to this application can implement a power conversion function in the semiconductor circuit through cooperation of the control module 205 (the control module 303 in FIG. 2) and the power module (the first power module 202, the second power module 203, or the power module 301) although specific working manners are different.

Figure 3:
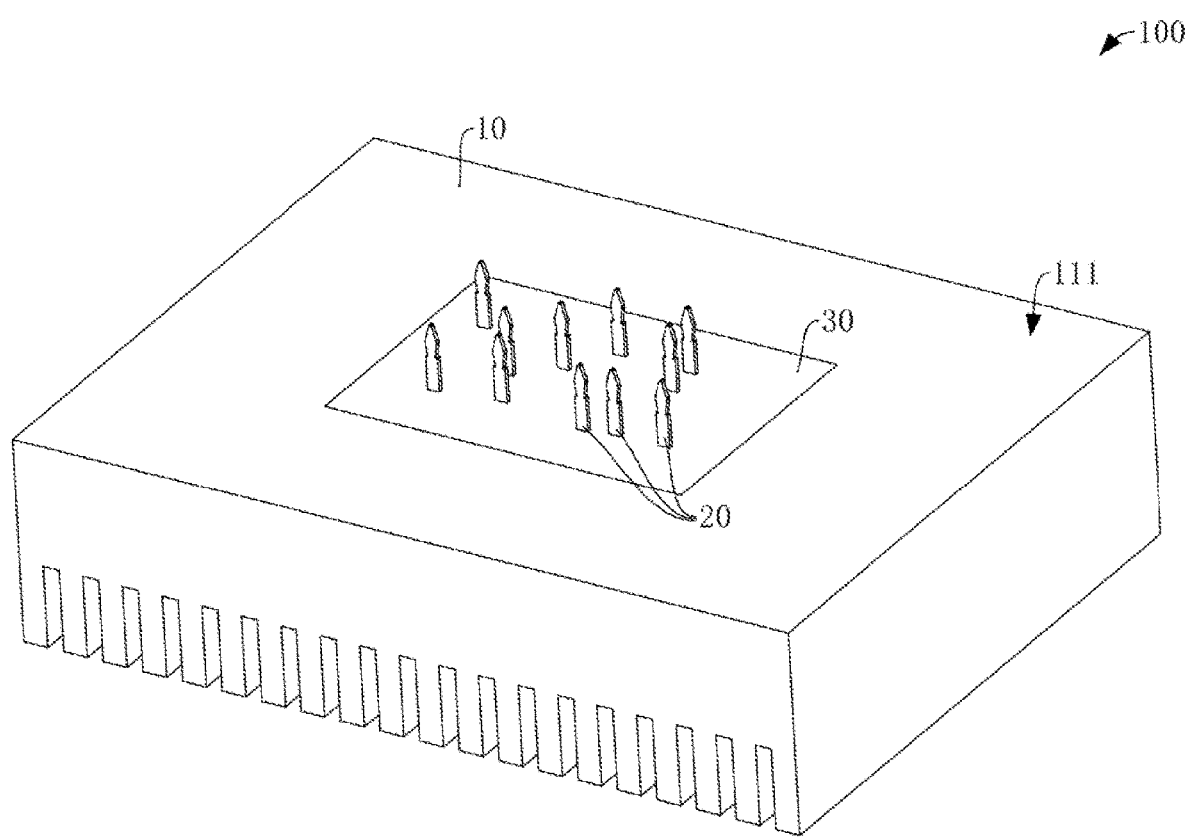
FIG. 3 is a schematic diagram of a structure of a power module according to an embodiment of this application.
Figure 4:
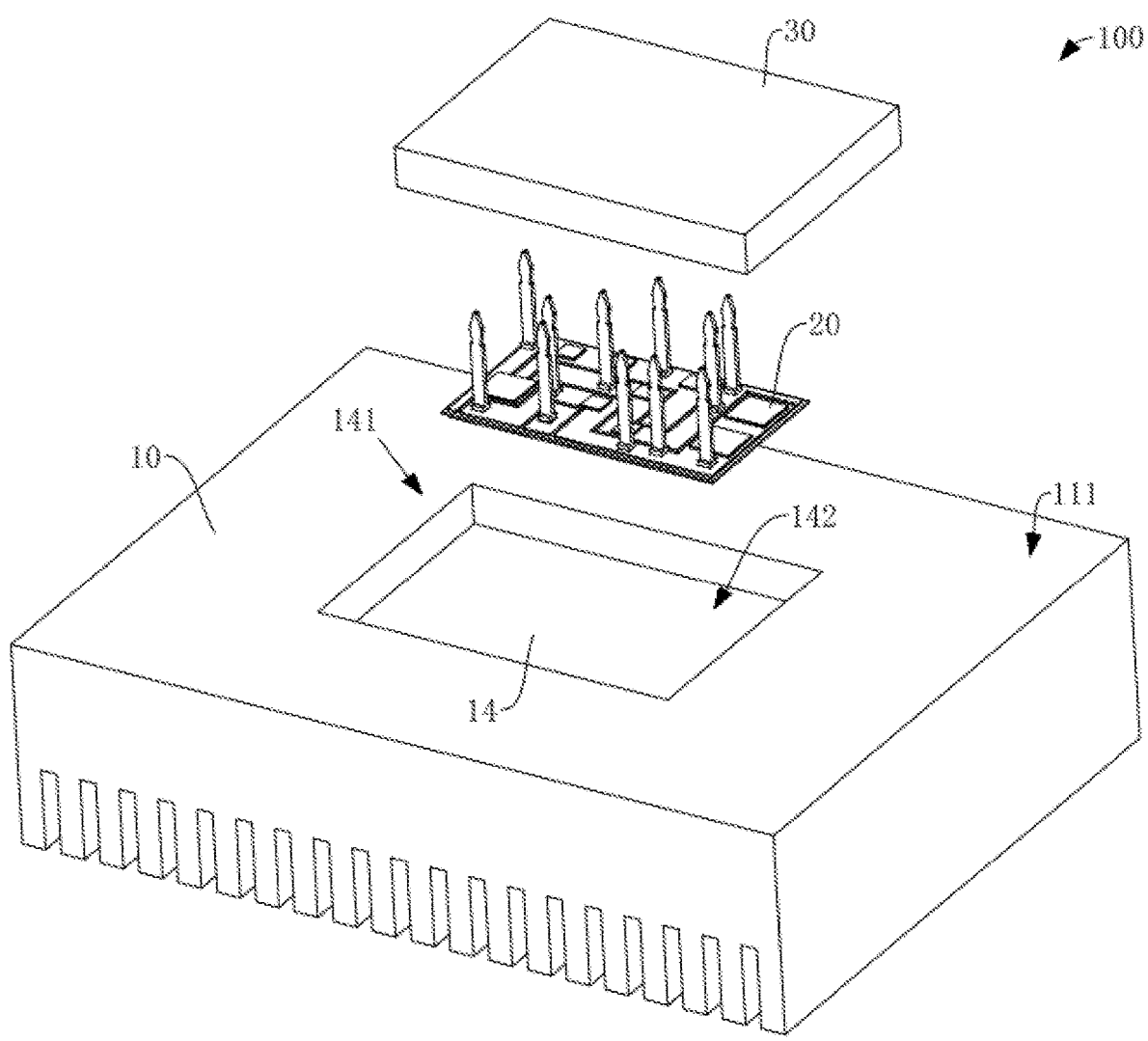
FIG. 4 is a schematic diagram of a decomposition structure of a power module according to an embodiment of this application.

FIG. 3 shows a specific structure of a power module 100 according to this application. It may be understood that the specific structure of the power module 100 may also be used as a specific structure of the first power module 202 or the second power module 203 shown in FIG. 1, or the power module 301 shown in FIG. 2. The specific structure of the power module 100 may be applied to any power converter involved in this application and used as any one or more power modules in a semiconductor circuit. For understanding, refer to a decomposition diagram of the power module 100 shown in FIG. 4 and a schematic diagram of a cross section of the power module 100 shown in FIG. 5.

Figure 6:
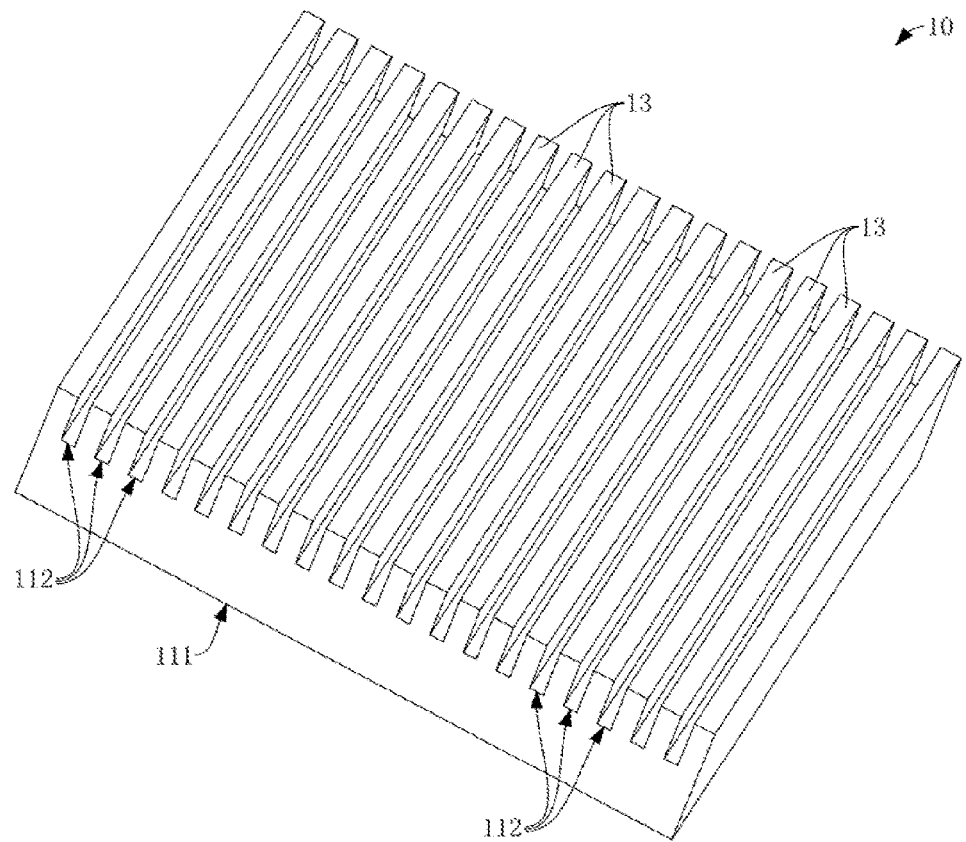
FIG. 6 is a schematic diagram of a structure of a housing in a power module according to an embodiment of this application.

The power module 100 includes a housing 10, a circuit component 20, and a package 30. The housing 10 includes a main housing 11. The main housing 11 has a first outer surface 111 and a second outer surface 112 that are opposite to each other. The housing 10 further includes a fastening layer 12 and heat sinks 13. The heat sinks 13 are disposed in a protruding manner on the second outer surface 112, and a groove 14 is formed in the second outer surface 112. As shown in FIG. 6, there are a plurality of heat sinks 13. The plurality of heat sinks 13 are distributed on the second outer surface 112 at intervals in a same direction. A main material of the housing 10 is aluminum, and a main material of the fastening layer 12 is copper. That is, main materials of the main housing 11 and the heat sinks 13 are aluminum. An aluminum material has relatively light weight and relatively good thermal conductivity. A heat dissipation area of the housing 10 may be increased through the disposing of the plurality of heat sinks 13, which is helpful to improve heat dissipation effect of the power module 100.

It should be proposed that, the main material of the housing 10 may also be another metal with a thermal conductivity greater than or equal to 120 W/mK in addition to aluminum. The thermal conductivity is the heat transferred per unit temperature gradient (the temperature decreases by 1 K within a length of 1 m) and per unit time by a unit heat conducting surface. In the conventional technology, metal such as copper, silver, or gold also has a thermal conductivity greater than or equal to 120 W/mK, and the foregoing metal may also be used as a main material of the housing 10 of the power module 100 in this application. It may be understood that when the main material of the housing 10 is aluminum, the weight of the housing 10 is relatively light, and costs are relatively low. Therefore, subsequent embodiments of this application are described based on that the main material of the housing 10 is aluminum.

On the other side, the main material of the fastening layer 12 may also be metal such as tin, nickel, or silver in addition to copper. Connections and fastenings between these materials and internal devices of the power module 100 are relatively stable, so that overall structural stability of the power module 100 can be improved. Subsequent embodiments of this application are described based on that the main material of the fastening layer 12 is copper. In embodiments of this application, a main material of "A" is "B", and it should be understood that a material of "A" is "B", or a material of "A" is a "B"-containing alloy.

Figure 7:
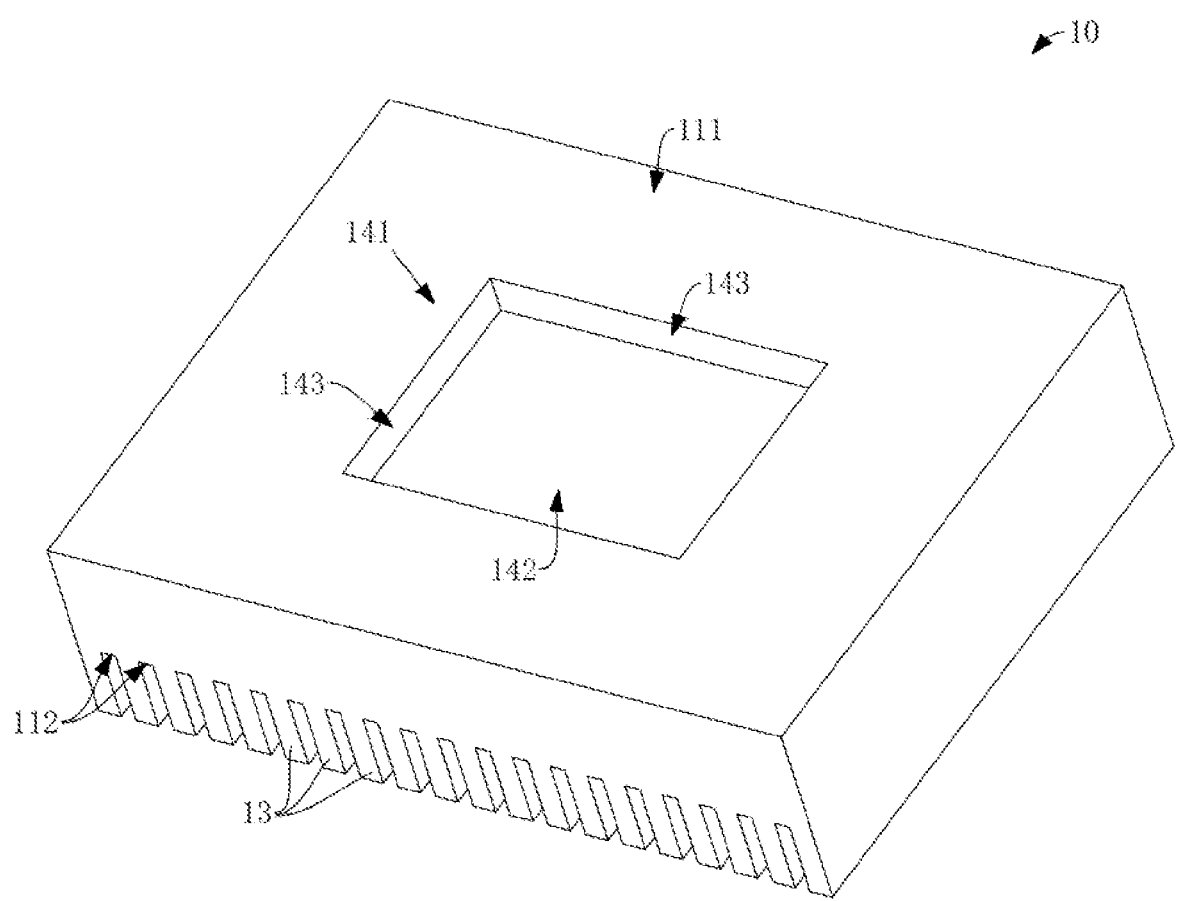
FIG. 7 is a schematic diagram of a structure of a housing in a power module according to an embodiment of this application from another perspective.

On a side of the first outer surface 111 shown in FIG. 7, the groove 14 is formed in the first outer surface 111, and has a groove opening 141 close to the first outer surface 111, a bottom surface 142 located between the second outer surface 112 and the first outer surface 111, and a side wall 143 connected between the bottom surface 142 and the first outer surface 111. The side wall 143 surrounds a periphery of the bottom surface 142, and encloses to form a structure of accommodating space with the bottom surface 142.

For the power module 100 in this application, the fastening layer 12 is disposed on the bottom surface 142 of the groove 14. Further, in an embodiment, the fastening layer 12 may be formed on the bottom surface 142 through electroplating. That is, electroplating is performed on the main housing 11 made of the aluminum material to attach copper to the bottom of the groove 14, so that the bottom surface 142 forms a structure of the fastening layer 12. The structure of the fastening layer 12 formed through electroplating may form a relatively good adhesion force with the aluminum material of the main housing 11, and does not easily fall off from the main housing 11.

However, in another embodiment, a copper block may also be further embedded into the bottom of the groove 14. The copper block may be embedded into the bottom of the groove 14 by extruding, and form interference fit with the groove 14. By controlling the interference between the copper block and the groove 14, a reliable connection between the copper block and the main housing 11 can also be ensured, so that the copper block does not easily fall off from the main housing 11. Thus, an outer surface, facing the groove opening 141, of a side of the copper block forms the bottom surface 142 of the groove 14, and the bottom surface 142 of the groove 14 also forms the structure of the fastening layer 12.

Figure 8:
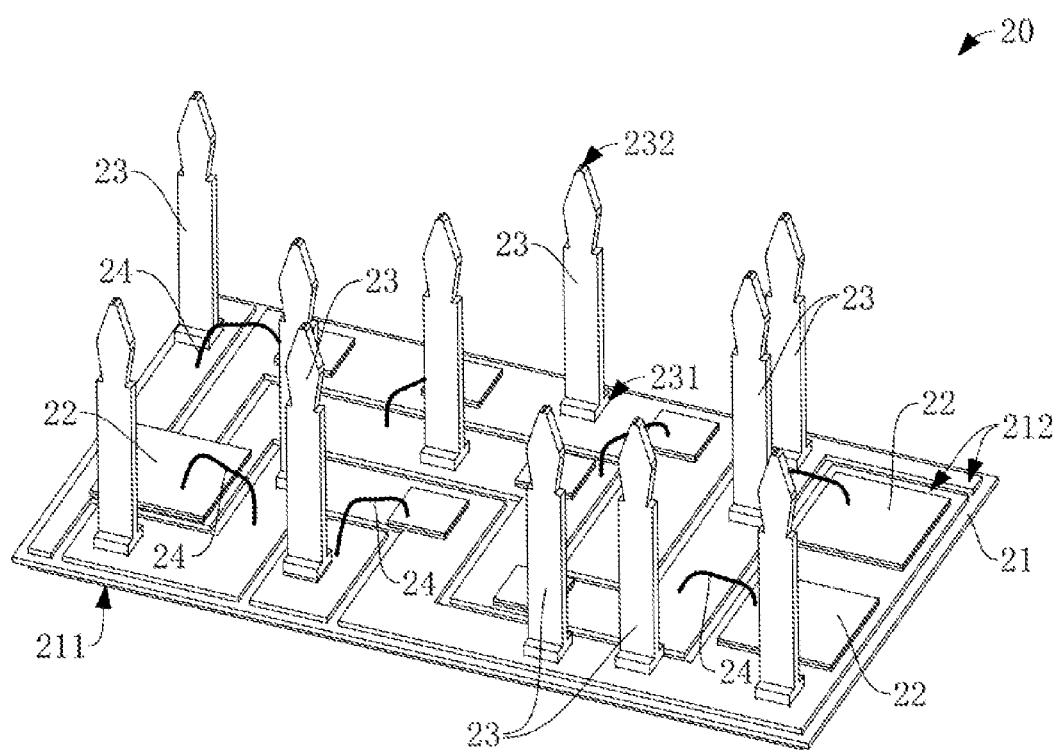
FIG. 8 is a schematic diagram of a structure of a circuit component in a power module according to an embodiment of this application.
Figure 9:
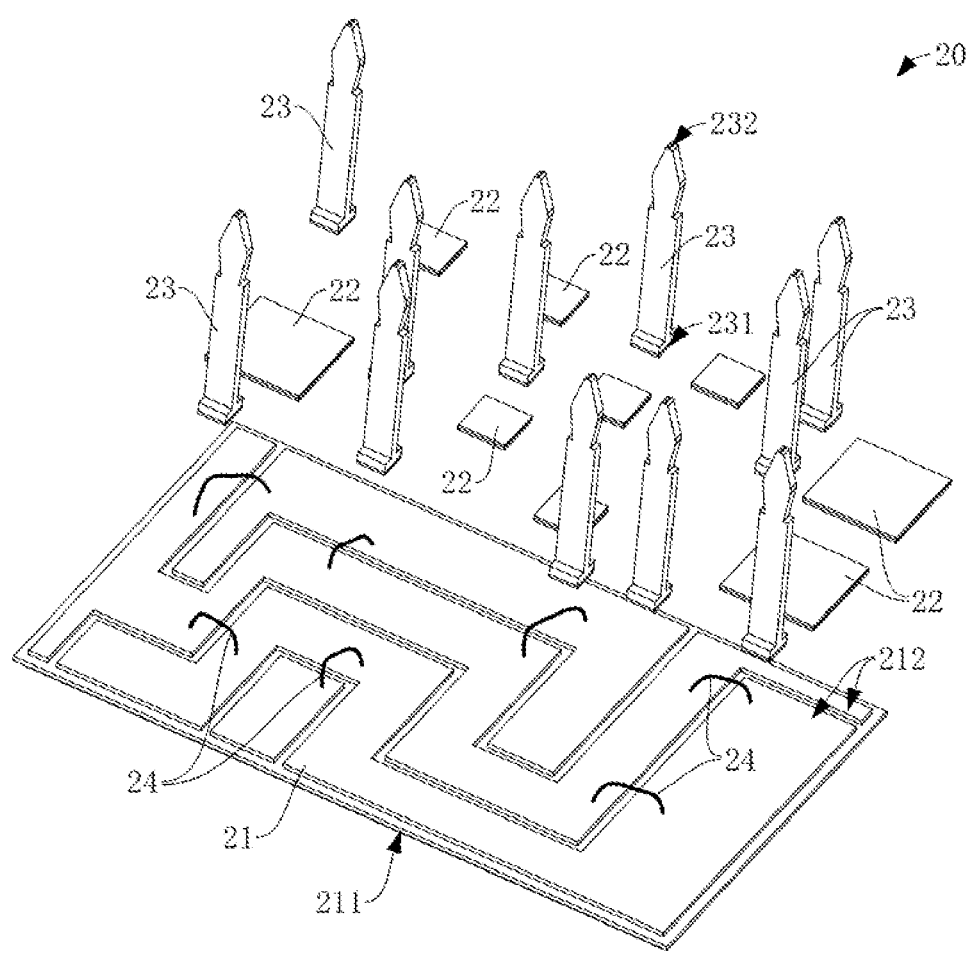
FIG. 9 is a schematic diagram of a decomposition structure of a circuit component in a power module according to an embodiment of this application.

It may be understood that when the main material of the fastening layer 12 is another material, the fastening layer 12 may also be formed on the bottom surface 142 of the groove 14 through electroplating, or formed on the bottom surface of the groove 14 in an embedded manner. The circuit component 20 is accommodated in the groove 14, and the structure of the fastening layer 12 on the bottom surface 142 is configured to be fastened to the circuit component 20 through welding and to implement reliable holding of the circuit component 20. For details, refer to schematic diagrams of a structure of the circuit component 20 shown in FIG. 8 and FIG. 9. FIG. 8 is a schematic diagram of a structure of the circuit component 20, and FIG. 9 is a decomposition diagram of the circuit component 20.

The circuit component 20 of the power module 100 in this application includes a circuit board 21, a chip 22, a pin 23, and a bonding wire 24. The circuit board 21 includes two opposite side surfaces, where one side surface is defined as a heat dissipation surface 211, and the other side surface is defined as a connection surface 212. Further, refer to a decomposition diagram of the circuit board 21 shown in FIG. 10. The circuit board 21 in this application includes a first copper layer 214, a ceramic substrate 213, and a second copper layer 215 that are sequentially stacked. The ceramic substrate 213 is located between the first copper layer 214 and the second copper layer 215, and the first copper layer 214 and the second copper layer 215 are respectively attached to two opposite side surfaces of the ceramic substrate 213. The circuit board 21 in this application may be implemented by using a copper-clad ceramic piece.

A surface that is of the first copper layer 214 and that is away from the ceramic substrate 213 is the heat dissipation surface 211 of the circuit board 21. The heat dissipation surface 211 further forms the heat dissipation surface 211 of the circuit component 20. The first copper layer 214 is configured to be fastened to the bottom surface 142 (that is, the fastening layer 12) of the groove 14 through welding. A surface that is of the second copper layer 215 and that is away from the ceramic substrate 213 is the connection surface 212 of the circuit board 21. The chip 22, the pin 23, and the bonding wire 24 are fastened to the second copper layer 215. There may be one or more chips 22, and each chip 22 is attached to the connection surface 212 of the second copper layer 215. In some embodiments, there may also be a plurality of circuit boards 21. The plurality of circuit boards 21 are arranged in parallel, and are separately stacked and fastened to the bottom surface 142 of the groove 14. Chips 22 and pins 23 are respectively carried on the plurality of circuit boards 21, which may be configured to jointly implement a function of the power module 100, or may be separately configured to implement different functions of the power module 100. This is not particularly limited in this application.

There may be a plurality of pins 23. Each pin 23 is approximately in a long strip shape, and includes a fixed end 231 and a connection end 232 opposite to each other in a length direction of the pin 23. The fixed end 231 of each pin 23 is fastened to the connection surface 212, and the connection end 232 of the pin 23 extends toward a direction away from the circuit board 21. Further, the connection end 232 of the pin 23 further extends out of the groove 14, and is exposed outside the first outer surface 111. That is, a length size of the pin 23 is greater than a depth size of the groove 14, so that the connection end 232 of the pin 23 can extend out of the housing 10, thereby facilitating connection between the pin 23 and external devices.

Further, the second copper layer 215 may also be patterned to match with a structure of the bonding wire 24 so as to implement an electrical connection between two chips 22 and/or between the chip 22 and the pin 23. Further, one end of the bonding wire 24 is connected to the chip 22, and the other end is connected to the pin 23 or another chip 22, that is, the bonding wire 24 is electrically connected between the chip 22 and the pin 23, or the bonding wire 24 is electrically connected between the two chips 22. The circuit component 20 in the power module 100 in this application may implement a preset power change function through cooperation of the chip 22, and implement connection to an external device through the connection end 232 of the pin 23.

Figure 10:
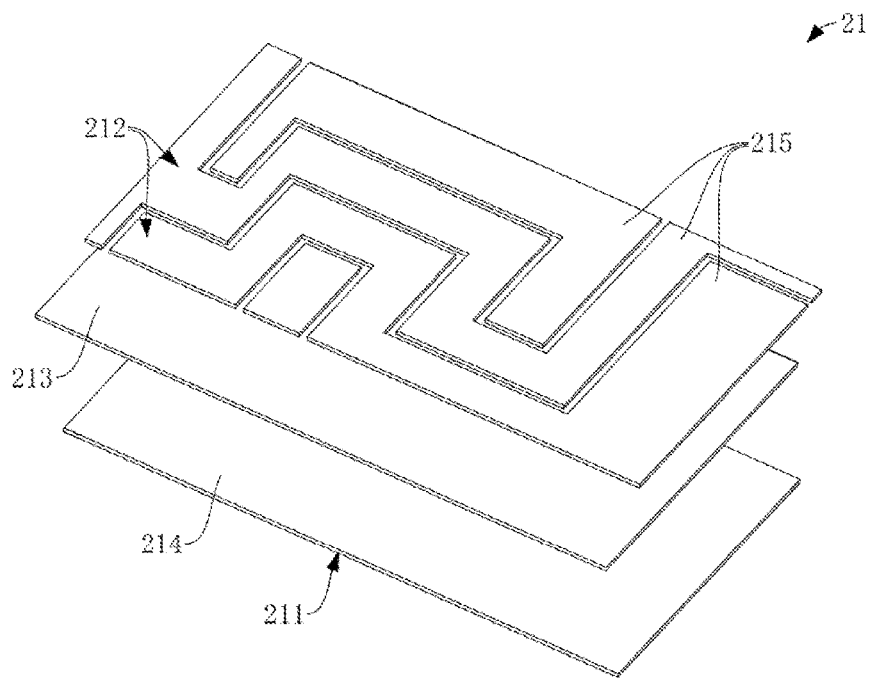
FIG. 10 is a schematic diagram of a decomposition structure of a circuit board in a power module according to an embodiment of this application.

It should be proposed that an identifier of the bonding wire 24 in FIG. 8 and FIG. 9 is only used to show a possibility of a connection manner of the bonding wire 24, and is not used to limit a specific connection relationship of the bonding wire 24 in the power module 100. In addition, a patterned structure of the second copper layer 215 shown in FIG. 8 to FIG. 10 is only used to show a possibility of patterning the second copper layer 215, and does not limit a specific patterned shape of the second copper layer 215. In an actual using process, based on a specific usage scenario of the power module 100 and a functional characteristic of the power module 100, a position and a connection relationship of the bonding wire 24 may be freely matched, and a patterned shape of the second copper layer 215 may be freely matched.

In some embodiments, the chip 22 may include one or more of an IGBT, a MOSFET, a diode, or a triode.

Figure 5:
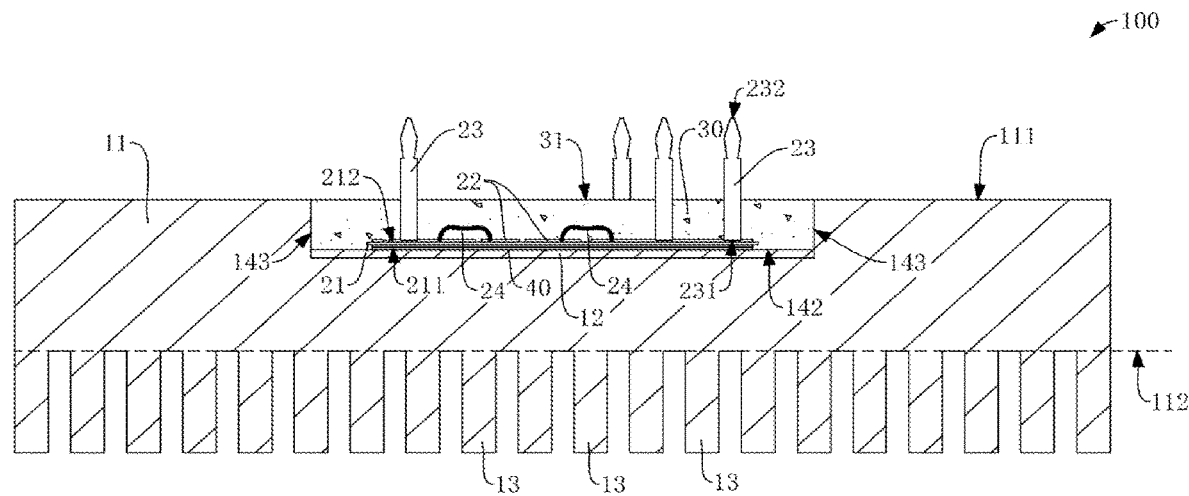
FIG. 5 is a schematic diagram of a cross section of a power module according to an embodiment of this application.

On one side of the first copper layer 214, the heat dissipation surface 211 is configured to be fastened to the bottom surface 142 (that is, the fastening layer 12) of the groove 14 through welding. Further, as shown in FIG. 5, a connection layer 40 may be further disposed between the fastening layer 12 and the heat dissipation surface 211. It is also described as that the circuit component 20 is fastened to the bottom surface 142 of the groove 14 through the connection layer 40 through welding. The connection layer 40 may be understood as a solder, and a main material of the connection layer 40 may be tin, silver, copper, or resin. Two opposite surfaces of the connection layer 40 are respectively attached to the bottom surface 142 and the heat dissipation surface 211, so as to fasten the circuit component 20 to the interior of the groove 14 through welding.

When the main material of the connection layer 40 is tin, the heat dissipation surface 211 may be fastened to the bottom surface 142 through welding by using tin soldering. When the main material of the connection layer 40 is silver, the heat dissipation surface 211 may be fastened to the bottom surface 142 using silver sintering or silver paste. When the main material of the connection layer 40 is copper, the heat dissipation surface 211 may be fastened to the bottom surface 142 through welding by using copper sintering. When the main material of the connection layer 40 is resin, the heat dissipation surface 211 may be fastened to the bottom surface 142 through welding by using a prepreg. Because the bottom surface 142 of the groove 14 is the fastening layer 12, and the main material of the fastening layer 12 is copper, it is convenient to form a structure of the connection layer 40 in the foregoing manners, heat conduction efficiency between the circuit component 20 and the main housing 11 is ensured, and the heat dissipation performance of the power module 100 is improved.

Compared with a solution in the conventional technology, in which a circuit board is attached to a radiator by using thermally conductive silicone grease, the connection layer 40 in the power module 100 in this application has higher heat conduction efficiency and more stable structure, a phenomenon that the thermally conductive silicone grease curls or falls off after a relatively long working time does not occur, and a service life of the power module 100 may be prolonged. In addition, a heat sink 13 is disposed on the main housing 11 of the power module 100 in this application, and heat generated when the circuit component 20 works may be directly dissipated through the housing 10. Compared with the power module in the conventional technology, a structure of a heat conducting plate is omitted, the heat conduction efficiency of the power module is higher, and better heat dissipation effect is also achieved.

The package 30 is filled in the groove 14. An outer surface of the package 30 is attached to both the bottom surface 142 and the side wall 143 of the groove 14, covers most structures of the circuit component 20, and only exposes the connection end 232 of the pin 23. A material of the package 30 may be epoxy resin (EMC) or silicon gel. The package 30 covers the circuit board 21, the chip 22, the fixed end 231 of the pin 23, and the bonding wire 24, which can form sealing protection on these devices, and prevent external water vapor from intruding into the circuit component 20 to cause damage to the circuit component 20. In addition, the attachment of the package 30 to the bottom surface 142 and the side wall 143 further prevents a risk that external water vapor intrudes into the groove 14.

As shown in FIG. 5, the package 30 includes a first surface 31. The first surface 31 is a surface that is of a side of the package 30 and that is away from the bottom surface 142 of the groove 14. In the schematic diagram of FIG. 5, the first surface 31 is flush with the first outer surface 111 of the main housing 11. In this case, the groove 14 is fully filled with the package 30. A fitting area between the package 30 and the side wall 143 of the groove 14 is relatively large, which may increase a holding force between the package 30 and the side wall 143, and improve connection stability of the package 30 in the groove 14. In addition, the first surface 31 is flush with the first outer surface 111, so that a volume of covering the circuit component 20 by the package 30 is also relatively large, and better protection effect may be achieved.

However, in some other embodiments, the first surface 31 of the package 30 may also be lower than the first outer surface 111. That is, a distance between the first surface 31 of the package 30 and the bottom surface 142 is less than a depth of the groove 14. In this case, the package 30 is integrally accommodated in the groove 14. Good sealing effect may also be achieved by covering the circuit component 20 by the package 30.

Because of the limitation that the connection end 232 of the pin 23 is located outside the first outer surface 111, and the first surface 31 of the package 30 is flush with the first outer surface 111 or is lower than the first outer surface 111, it can be ensured that the connection end 232 of the pin 23 is exposed outside the package 30. The package 30 is made of an insulation material. When an external device is connected to the pin 23, a material of the package 30 cannot be formed at the connection end 232, which can ensure reliable conduction between the pin 23 and the external device.

In this way, the external device may be electrically connected to the power module 100 through the pin 23. An electrical signal enters the chip 22 through the bonding wire 24 after entering the power module 100 in this application through the pin 23 (there may be a plurality of pins 23) on one side, and may be transmitted through the bonding wire 24 to the pin 23 (there may be a plurality of pins 23) on the other side for outputting after power conversion is completed, so as to achieve power conversion effect of the power module 100 in this application.

For a power module in the conventional technology, a circuit component of the power module is generally only covered through a package. When a breakdown phenomenon occurs, a structure similar to the package is insufficient to shield an arc generated by breakdown, and devices around the power module in the conventional technology will be damaged accordingly. However, the circuit component 20 of the power module 100 in this application is accommodated in the groove 14, and both the bottom surface 142 and the side wall 143 of the groove 14 are metal structures. When a breakdown phenomenon occurs in a working process of the power module 100 due to insufficient heat dissipation, an excessively large transient current, or the like, the bottom surface 142 and the side wall 143 of the metal structure can limit the arc to spread outward, so as to achieve protection effect on the devices around the power module 100. An arc damage caused by breakdown is emitted only from the groove opening 141 of the groove 14, so that an arc direction of the power module 100 in this application is controllable when the breakdown occurs, thereby reducing a damage range.

It may be understood that the power converter according to this application also has characteristics such as high reliability, a strong heat dissipation capability, and relatively small damage in the case of fault due to application of the foregoing power module 100. However, the power supply device in this application achieves similar beneficial effect because of using the power converter.

Figure 11:
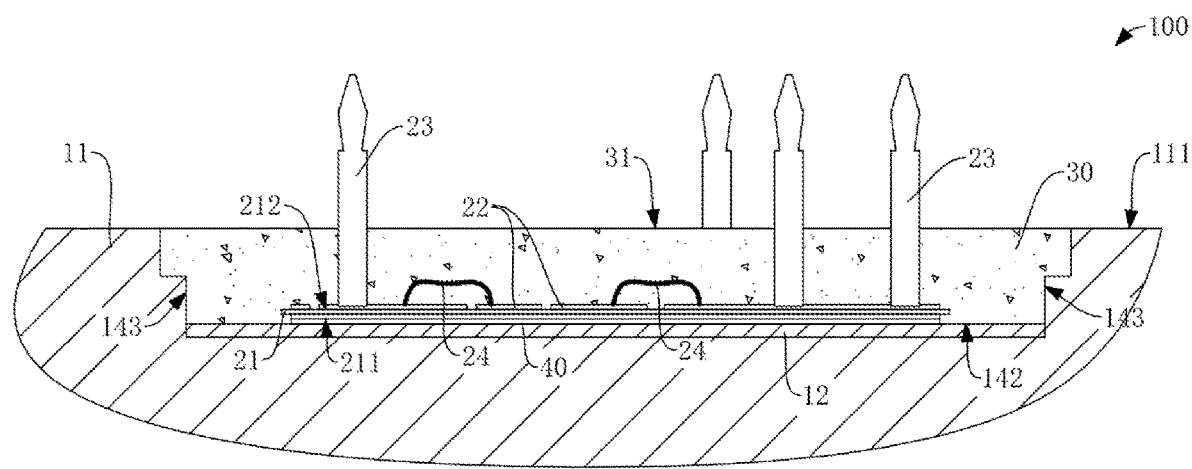
FIG. 11 is a schematic diagram of a partial cross section of another power module according to an embodiment of this application.

For an embodiment, refer to FIG. 11. On any cross section perpendicular to the first outer surface 111, a shape of a side wall 143 of the groove 14 may be further constructed as a stepped shape. Because the package 30 is formed in the groove 14 by using a filling process, a surface, in contact with the side wall 143, of the package 30 is also formed into a stepped shape with the shape of the side wall 143. The step-shaped side wall 143 may form a larger contact area with the step-shaped package 30, so as to form a larger holding force for the package 30, and ensure structural stability of the package 30 in the groove 14. It may be understood that, in some other embodiments, a shape of a cross section of the side wall 143 may also be another shape such as an arc, a trapezoid, or a wave shape, and correspondingly, a surface of the package 30 is also formed into a structure matched with the side wall 143, so that effect of increasing a contact area between the package 30 and the side wall 143 may also be achieved.

In the schematic diagram of FIG. 11, the width of the groove opening 141 of a step structure of the side wall 143 is greater than the width of the bottom surface 142. That is, the step structure of the side wall 143 is in a state of being large above and small below. The structure facilitates filling of the package 30, and avoids generating bubbles inside the package 30 to affect sealing effect of the package 30.

Figure 12:
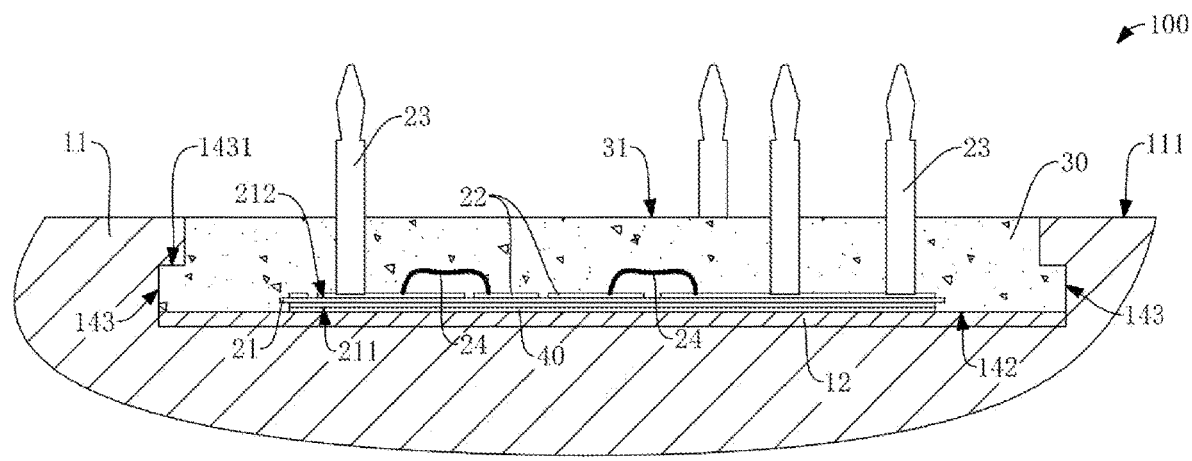
FIG. 12 is a schematic diagram of a partial cross section of yet another power module according to an embodiment of this application.

However, in some other embodiments, as shown in FIG. 12, the step structure of the side wall 143 may alternatively be in a state of being small above and large below. That is, the width of the groove opening 141 is less than the width of the bottom surface 142. In this case, in the step structure of the side wall 143, a fitting direction of an abutting surface 1431 parallel to the bottom surface 142 and the package 30 is toward one side of the bottom surface 142, and the abutting surface 1431 may form an abutting force toward the bottom surface 142 on the package 30. Under effect of the abutting force, the groove 14 can achieve better holding effect on the package 30.

On the other side, after the power module 100 in this application is used for a long time, the package 30 may be deformed due to an impact of thermal fatigue effect. Consequently, a crack and an insecure connection may occur between the package 30 and the side wall 143. In this case, reliable fitting between the abutting surface 1431 and the package 30 may also be kept, that is, the side wall 143 of the step structure may still be in partial fitting with the package 30, thereby ensuring the sealing reliability of the package 30 and prolonging a service life of the power module 100.

Figure 13:
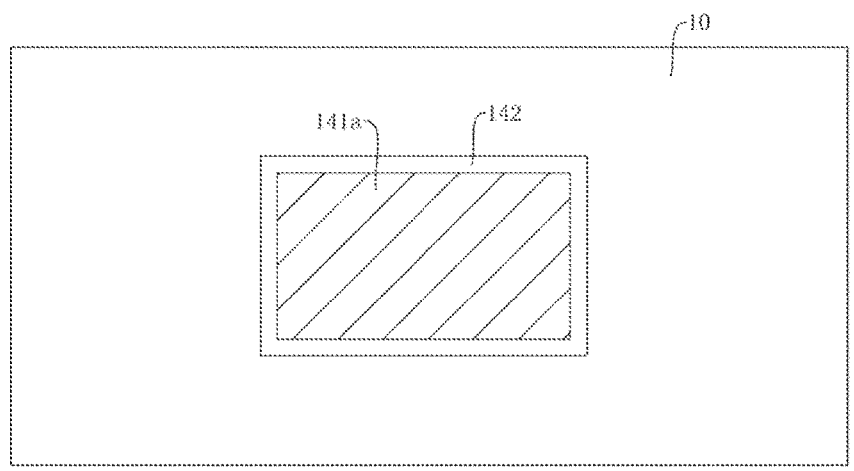
FIG. 13 is a schematic diagram of a plane structure of a bottom surface of a groove in yet another power module according to an embodiment of this application.

For an embodiment, refer to FIG. 13, which may be understood as a schematic plane diagram of the bottom surface 142 in the structure shown in FIG. 12. In the schematic diagram of FIG. 13, the groove opening 141 forms projection 141a on the bottom surface 142. The projection 141a is accommodated within the bottom surface 142. In this way, a continuous structure of the abutting surface 1431 may be formed on a periphery of the side wall 143, so as to improve effect of holding the package 30 by the side wall 143. It may be understood that, the cross section of the side wall 143 may also be in another shape such as an arc or a trapezoid, and effect that the projection 141a of the groove opening 141 is accommodated within the bottom surface 142 may also be achieved. In this case, an area of the package 30 close to the groove opening 141 is relatively small, and an area close to the bottom surface 142 is relatively large. The package 30 in the groove 14 is connected more stably, and does not easily fall off from the groove 14.

Figure 14:
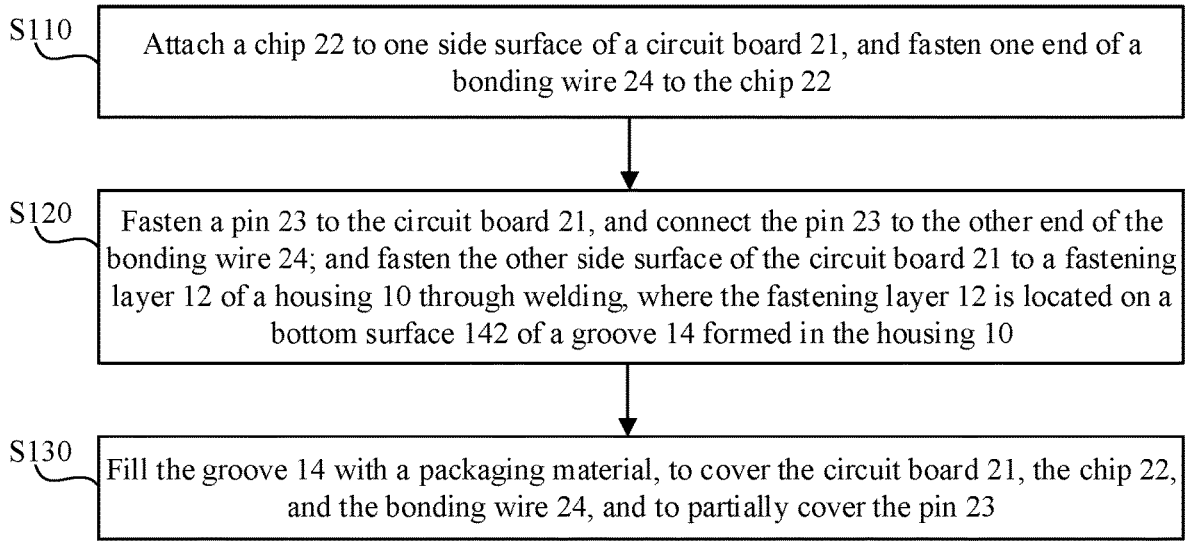
FIG. 14 is a flowchart of steps of a method for manufacturing a power module according to an embodiment of this application.

FIG. 14 shows a flowchart of a method for manufacturing a power module according to this application. In this embodiment, the manufacturing method for a power module 100 includes the following steps:

S110: Attach a chip 22 to one side surface of a circuit board 21, and fasten one end of a bonding wire 24 to the chip 22.

S120: Fasten a pin 23 to the circuit board 21, and connect the pin 23 to the other end of the bonding wire 24; and fasten the other side surface of the circuit board 21 to a fastening layer 12 of a housing 10 through welding, where the fastening layer 12 is located on a bottom surface 142 of a groove 14 formed in the housing 10.

S130: Fill the groove 14 with a packaging material, to cover the circuit board 21, the chip 22, and the bonding wire 24, and to partially cover the pin 23.

Further, the manufacturing method for a power module of this embodiment is used for implementing the structure of the foregoing power module 100. For details, refer to schematic diagrams of a structure in FIG. 15A to FIG. 15F.

Figure 15A:
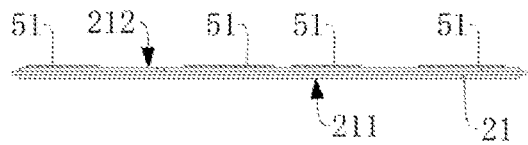
FIG. 15A to FIG. 15F are schematic diagrams of structures of steps of a method for manufacturing a power module according to an embodiment of this application.
Figure 15B:
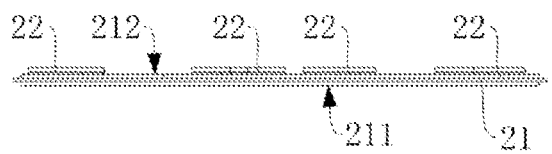
Figure 15C:
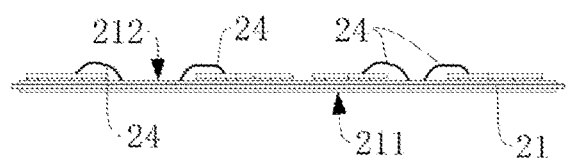

In S110, a circuit board 21 is first provided. The circuit board 21 may be a copper-clad ceramic substrate. The circuit board 21 includes a heat dissipation surface 211 and a connection surface 212 that are opposite to each other. Then, as shown in FIG. 15A, a solder layer 51 is laid on the connection surface 212 of the circuit board 21. A position of the solder layer 51 is disposed corresponding to a position at which the chip 22 is carried subsequently. In the schematic diagram of FIG. 15B, the chip 22 is attached to a position at which the solder layer 51 is disposed on the connection surface 212. The chip 22 may be attached by using solder reflow, silver sintering, or copper sintering. However, in the schematic diagram of FIG. 15C, a bonding wire 24 is disposed on the chip 22. The bonding wire 24 may be connected between two chips 22, or may be connected between the chip 22 and the connection surface 212. It may be understood that, when the bonding wire 24 is disposed between the chip 22 and the connection surface 212, one end that is of the bonding wire 24 and that is away from the chip 22 is configured to communicate with a pin 23 subsequently carried.

Figure 15D:
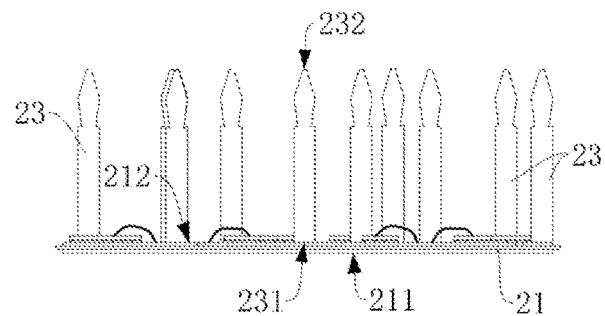
Figure 15E:
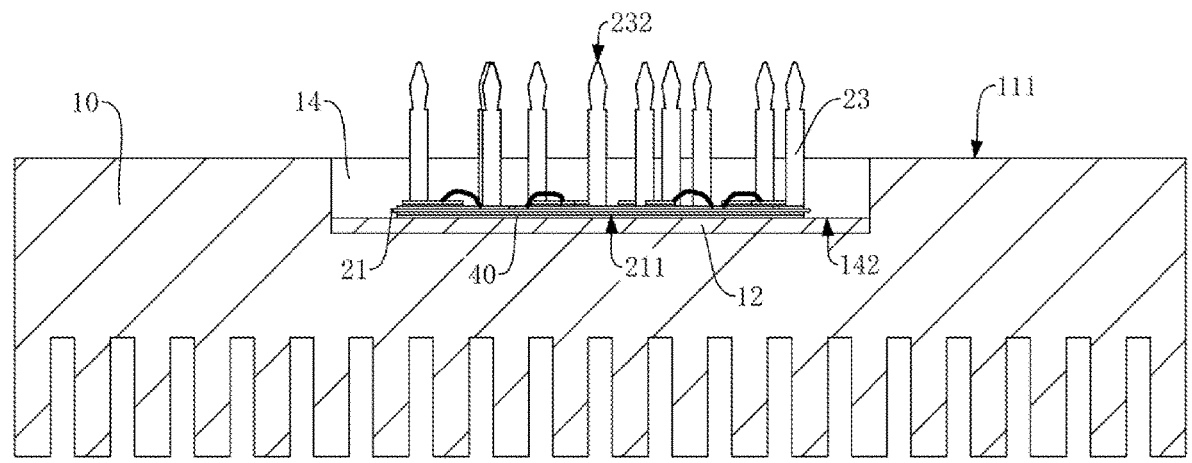

In S120, as shown in FIG. 15D, a fixed end 231 of the pin 23 is welded to the connection surface 212 of the circuit board 21. In addition, the pin 23 is connected to one end that is of the bonding wire 24 and that is away from the chip 22. The connection end 232 of the pin 23 extends toward a direction away from the circuit board 21. In this way, a structure of the circuit component 20 in the power module 100 in this application may be formed. Then, as shown in FIG. 15E, the heat dissipation surface 211 of the circuit board 21 is fastened to the fastening layer 12 of the housing 10 through welding. Further, the fastening layer 12 is located at the bottom surface 142 of the groove 14 formed in the main housing 11. The heat dissipation surface 211 may be fastened to the fastening layer 12 through welding by disposing a connection layer 40 between the bottom surface 142 and the heat dissipation surface 211. After this step is completed, the height of the connection end 232 of the pin 23 is higher than the depth of the groove 14, that is, the connection end 232 of the pin 23 extends out of the groove 14.

Figure 15F:
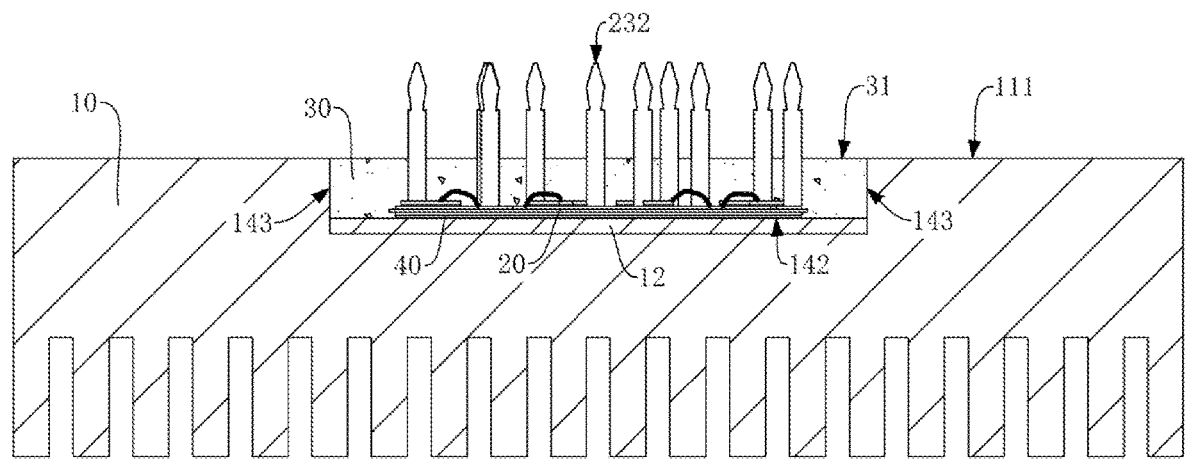

In S130, as shown in FIG. 15F, injection molding is performed in the groove 14 by using a packaging material, so as to manufacture a structure of the package 30. A material of the package 30 may be epoxy resin or silicon gel. The package 30 is in contact with both the bottom surface 142 and the side wall 143 of the groove 14, and is configured to cover the circuit board 21, the chip 22, the bonding wire 24, and the pin 23 located in the groove 14, so as to form sealing protection for the circuit component 20 in the power module 100. The injection molding height of the package 30 is less than or equal to the depth of the groove 14 of the main housing 11, so that the package 30 does not penetrate out of the groove 14, and the package 30 is prevented from covering a part of the pin 23 exposed in the groove 14, thereby ensuring connection reliability of the power module 100 and an external device.

Therefore, the power module 100 according to this application may be obtained by the foregoing manufacturing method for a power module. It may be understood that the power module 100 manufactured by the method in this application also has characteristics, brought by the foregoing power module 100, such as high reliability, a strong heat dissipation capability, and relatively small damage in the case of fault. Details are not further described in this embodiment.

It should be proposed that, in S120 of the method in this application, the "fasten the other side surface of the circuit board 21 to a fastening layer 12 of a housing 10 through welding" may use tin soldering, silver sintering, copper sintering, silver paste, or a prepreg. Because the bottom surface 142 of the groove 14 is disposed as a fastening layer, after the groove 14 is fastened and connected to the circuit component 20 by using the foregoing process, heat conduction efficiency between the circuit component 20 and the groove 14 may be improved.

On the other side, in S120, an assembly sequence of the pin 23 and the heat dissipation surface 211 is not strictly limited. Based on different solders used by the welding pin 23 and the heat dissipation surface 211, the assembly sequence of the pin 23 and the heat dissipation surface 211 in S120 may be matched and set according to melting points of different solders.

For example, in decomposition steps shown in FIG. 15D and FIG. 15E, the pin 23 is first fastened to the circuit board 21 to form a complete circuit component 20, and then the circuit component 20 is fastened in the groove 14 (that is, fastening and connection between the heat dissipation surface 211 and the bottom surface 142 are completed). The manufacturing sequence is applicable to a case in which a melting point of a solder for the pin 23 is higher than that of a solder for the heat dissipation surface 211.

Further, in the embodiment shown in FIG. 15D in which the pin 23 is fastened to the circuit board 21, solder paste printing, solder pad attachment, silver paste printing, or the like may be used for implementation. For example, when the solder paste printing is used, solder paste (solder) with a model of SAC305 may be used, and a melting point of the solder paste is about 217 degrees Celsius (° C.). When the heat dissipation surface 211 is fastened to the bottom surface 142 as shown in FIG. 15E through welding, a low-temperature lead-free welding manner may be used for implementation. For example, when low-temperature tin soldering is used, the solder may be a tin-bismuth solder (SnBi), and a melting point of the solder is about 139° C., which is lower than a melting point of the solder for the pin 23. Therefore, after the pin 23 is fastened to the circuit board 21, in the process of welding and fastening the heat dissipation surface 211 to the bottom surface 142, the soldering temperature does not cause remelting of the solder for the pin 23, and connection stability between the pin 23 and the circuit board 21 is ensured.

Figure 16A:
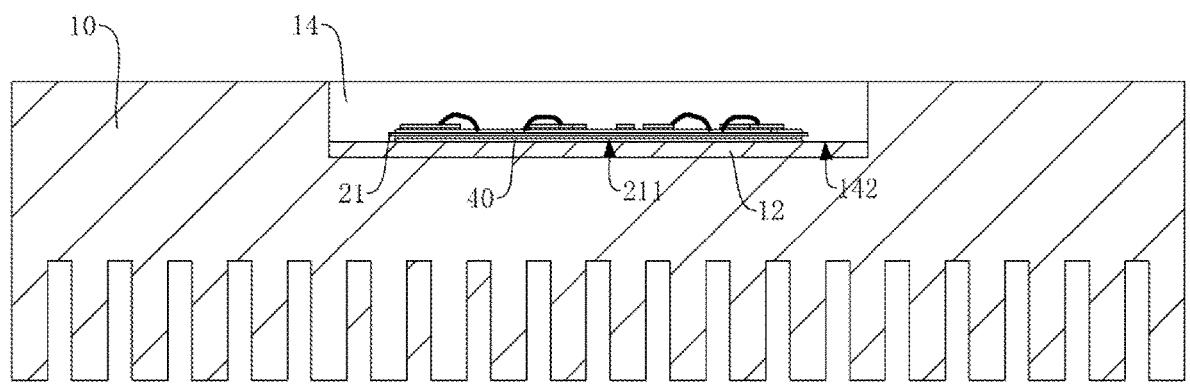
FIG. 16A and FIG. 16B are schematic diagrams of a structure of another implementation sequence of S120 in a method for manufacturing a power module according to an embodiment of this application.
Figure 16B:
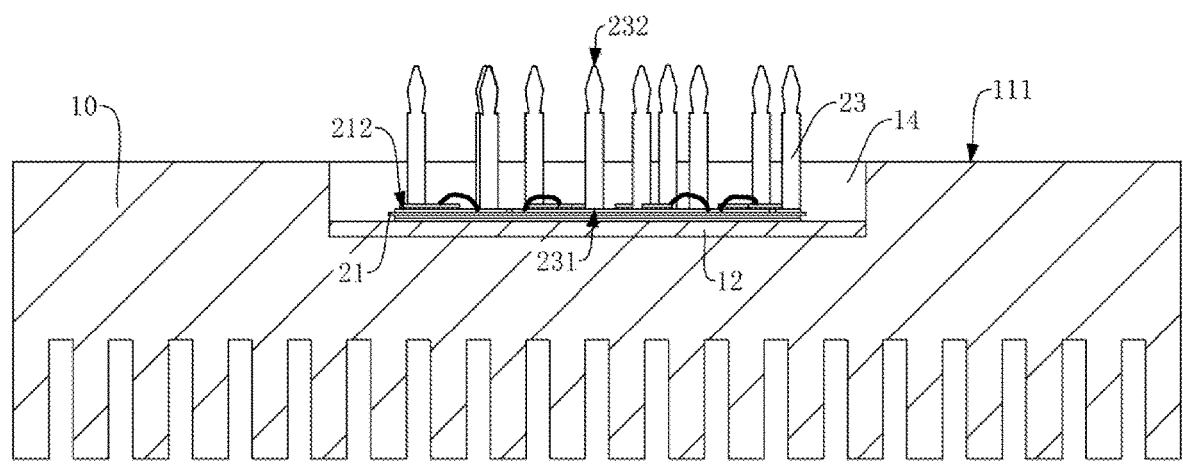

However, in decomposition steps shown in FIG. 16A and FIG. 16B, in S120, the heat dissipation surface 211 may also be first fastened to the bottom surface 142 through welding, and then the pin 23 is fastened to the connection surface 212 of the circuit board 21. The manufacturing sequence is applicable to a case in which the melting point of the solder for the pin 23 is lower than that of the solder for the heat dissipation surface 211.

Further, as shown in FIG. 16A, when the heat dissipation surface 211 is fastened to the bottom surface 142 through welding, a tin soldering manner may be used for implementation. The solder may be tin-antimony solder (SnSb), and a melting point of the solder ranges from 235° C. to 245° C. In the embodiment shown in FIG. 16B in which the pin 23 is fastened to the circuit board 21, manners, such as solder paste printing, solder pad attachment, and silver paste printing, may also be used. For example, the solder paste (solder) with the model of SAC305 may be used, and a melting point of the solder paste is about 217° C., which is lower than that of the tin-antimony solder. Therefore, in a process of fastening the pin 23 to the circuit board 21, a soldering temperature of the pin 23 does not cause remelting of the solder for the heat dissipation surface 211, and connection stability between the heat dissipation surface 211 and the bottom surface 142 is ensured.

The foregoing descriptions are merely specific embodiments of this application, but are not intended to limit the protection scope of this application. Any variation or replacement, for example, reducing or adding a mechanical part, and changing a shape of a mechanical part, readily figured out by a person skilled in the art within the technical scope disclosed in this application shall fall within the protection scope of this application. When no conflict occurs, embodiments of this application and the features in the embodiments may be mutually combined. Therefore, the protection scope of this application shall be subject to the protection scope of the claims.

What is claimed is:

1. A power module, comprising:
    a housing, comprising:
        a main housing having a groove and a first outer surface, wherein a groove opening of the groove is located on the first outer surface;
        a heat sink located on a side of the housing away from the groove opening; and
        a fastening layer disposed on a bottom surface of the groove, wherein a first width of the groove opening is less than a second width of the bottom surface;
    a circuit component accommodated in the groove and comprising:
        a heat dissipation surface fastened to the fastening layer; and
        a pin comprising a distal end extending out of the first outer surface, wherein the pin extends in a direction away from the fastening layer; and
    a package configured to cover the circuit component and to at least partially expose the distal end of the pin, wherein the package is filled in the groove.

2. The power module of claim 1, wherein the fastening layer is electroplated to the bottom surface of the groove.

3. The power module of claim 1, wherein a main material of the fastening layer is copper, tin, nickel, or silver.

4. The power module of claim 1, further comprising a connection layer disposed between the fastening layer and the heat dissipation surface, wherein a main material of the connection layer is tin, silver, copper, or resin.

5. The power module of claim 1, wherein main materials of the main housing and the heat sink are metal with a thermal conductivity greater than or equal to 120 Watts/meter-Kelvin (W/mK).

6. The power module of claim 1, wherein the circuit component further comprises:
    a circuit board comprising:
        a first side surface forming the heat dissipation surface; and
        a second side surface;
    a chip attached to the second side surface; and
    a bonding wire attached to the second side surface and connected between the chip and the pin.

7. The power module of claim 6, wherein the circuit board further comprises:
    a ceramic substrate comprising a first ceramic side and a second ceramic side opposite the first ceramic side;
    a first copper layer attached to the first ceramic side, wherein the heat dissipation surface is formed on the first copper layer; and
    a second copper layer attached to the second ceramic side.

8. The power module of claim 1, wherein the package comprises:
    a top side flush with or lower than the first outer surface; and
    a bottom side coupled to the bottom surface of the groove and opposite the top side.

9. The power module of claim 1, wherein a material of the package is epoxy resin or silicon gel.

10. The power module of claim 1, wherein the groove comprises a side wall connected between the first outer surface and the bottom surface, and wherein a shape of any cross section that is of the side wall and that is perpendicular to the first outer surface is a stepped shape.

11. A manufacturing method for a power module and comprising:
    attaching a chip to a first side surface of a circuit board;
    fastening a first end of a bonding wire to the chip;
    fastening a pin to the circuit board;
    connecting the pin to a second end of the bonding wire;
    fastening a second side surface of the circuit board to a fastening layer of a housing so that the fastening layer is located on a bottom surface of a groove formed in the housing, wherein a first width of a groove opening of the groove is less than a second width of the bottom surface; and
    filling the groove with a packaging material to cover the circuit board, the chip, and the bonding wire, and to partially cover the pin.

12. The manufacturing method of claim 11, wherein fastening the second side surface of the circuit board to the fastening layer comprises fastening the second side surface of the circuit board to the fastening layer using tin soldering, silver sintering, copper sintering, silver paste, or prepreg.

13. A power converter, comprising:
    a power module, comprising:
        a housing, comprising:
            a main housing having a groove and a first outer surface, wherein a groove opening of the groove is located on the first outer surface;
            a heat sink located on a side away from the groove opening; and
            a fastening layer disposed on a bottom surface of the groove, wherein a first width of the groove opening is less than a second width of the bottom surface;
        a circuit component accommodated in the groove and comprising:
            a heat dissipation surface fastened to the fastening layer; and
            a pin comprising a distal end extending out of the first outer surface, wherein the pin extends in a direction away from the fastening layer; and
        a package configured to cover the circuit component and to at least partially expose the distal end of the pin, wherein the package is filled in the groove; and
    a control module coupled to the power module and configured to control an on or off state of the power module to implement power conversion.

14. The power converter of claim 13, further comprising a connection layer disposed between the fastening layer and the heat dissipation surface, wherein a main material of the connection layer is tin, silver, copper, or resin.

15. The power converter of claim 13, wherein main materials of the main housing and the heat sink are metal with a thermal conductivity greater than or equal to 120 Watts/meter-Kelvin (W/mK).

16. The power converter of claim 13, wherein the circuit component further comprises:
- a circuit board comprising:
  - a first side surface forming the heat dissipation surface; and
  - a second side surface;
- a chip attached to the second side surface; and
- a bonding wire attached to the second side surface and connected between the chip and the pin.

17. The power converter of claim 16, wherein the circuit board further comprises:
- a ceramic substrate comprising a first ceramic side and a second ceramic side opposite the first ceramic side;
- a first copper layer attached to the first ceramic side, wherein the heat dissipation surface is formed on the first copper layer; and
- a second copper layer attached to the second ceramic side.

18. The power converter of claim 13, wherein the package comprises:
- a top side flush with or lower than the first outer surface; and
- a bottom side coupled to the bottom surface of the groove and opposite the top side.

19. The power module of claim 1, wherein the fastening layer is formed on a bottom of the groove in an embedded manner.

20. The power converter of claim 13, wherein the groove comprises a side wall connected between the first outer surface and the bottom surface, and wherein a shape of any cross section that is of the side wall and that is perpendicular to the first outer surface is a stepped shape.

* * * * *